(12) United States Patent
Garabieta Artiagoitia et al.

(10) Patent No.: US 8,968,027 B2
(45) Date of Patent: Mar. 3, 2015

(54) HIGH-VOLTAGE COUPLING DEVICE

(71) Applicant: Arteche Lantegi Elkartea, S.A., Munguia (Vizcaya) (ES)

(72) Inventors: Inaki Garabieta Artiagoitia, Munguia (ES); Alfonso Montero Bouza, Munguia (ES)

(73) Assignee: Arteche Lantegi Elkartea, S.A. (ES)

( * ) Notice: Subject to any disclaimer, the term of this patent is extended or adjusted under 35 U.S.C. 154(b) by 130 days.

(21) Appl. No.: 13/716,266

(22) Filed: Dec. 17, 2012

(65) Prior Publication Data

US 2013/0171877 A1 Jul. 4, 2013

(30) Foreign Application Priority Data

Dec. 16, 2011 (EP) ..................................... 11382382

(51) Int. Cl.
*H01R 13/66* (2006.01)
*G01R 15/04* (2006.01)
*H04B 3/56* (2006.01)

(52) U.S. Cl.
CPC *G01R 15/04* (2013.01); *H04B 3/56* (2013.01); *H04B 2203/5483* (2013.01)
USPC .................................................. 439/620.08

(58) Field of Classification Search
CPC ............. H04B 3/56; H04B 2203/5483; H01R 13/6666; H01R 4/2429
USPC ........................................ 439/620.08, 620.04
See application file for complete search history.

(56) References Cited

U.S. PATENT DOCUMENTS 6,040,759 A * 3/2000 Sanderson ..................... 725/130
2005/0264374 A1* 12/2005 Podell ............................ 333/109

FOREIGN PATENT DOCUMENTS

EP 2605416 A1 * 6/2013 ............... H04B 3/56

* cited by examiner

*Primary Examiner* — Hae Moon Hyeon
(74) *Attorney, Agent, or Firm* — Cantor Colburn LLP

(57) ABSTRACT

The present invention relates to an electric coupler for high-voltage DIN C type cells comprising a voltage divider, a condenser and two terminal contacts and wherein the condenser is elongated and its ends are in contact with the two terminals of the coupling device, occupying an axis parallel to the imaginary central axis of the connector passing through the two contacts and wherein the resistances of the divider are aligned and parallel to the mentioned axis of the zig-zag device. As a result of this arrangement the insulation can be assured and the field distributions of both systems are compatible with one another and with those of the DIN C connector.

5 Claims, 2 Drawing Sheets

HIGH-VOLTAGE COUPLING DEVICE

FIELD OF THE INVENTION

The present invention relates to coupling devices coupleable to high-voltage distribution cells which allow injecting high frequency signals into the electric circuit.

BACKGROUND OF THE INVENTION

A plug-in coupler for gas insulated high-voltage electric distribution cells comprises an outer insulating body made of resin housing therein metal contacts or connectors for electrical connection to a high-voltage cell (for example through a T-shaped connector coupled to the cell). Generally the cells are three phase cells, therefore they comprise three T-shaped connectors and three couplers, one for each phase. The coupler is designed to enable injecting signals between 2 and 40 Mhz into a high-voltage conductor. The device must achieve two functions, having an impedance to the high frequency signals of very low value to enable coupling them to the high-voltage conductor and a very high impedance at 50 Hz, thus being able to assure the insulation level of the device taking into account that it is connected to high voltage.

The coupler therefore comprises one or several ceramic condensers having a high impedance at 50 Hz and low impedance at frequencies of the order of Mhz.

The coupler, as can be seen in FIG. 2 is frustoconical shaped (according to DIN C standard) and incorporates a low-voltage circuit for tuning the equipment to the impedances of the line and obtaining a maximum performance in high frequency signal transmission. This circuit is made up of a coil and an impedance adaptation transformer (FIG. 1, reference 20).

Sometimes it is also necessary to accurately measure the line voltage, for which the coupling device should house a voltage divider therein. The condenser needed to perform the mentioned function of the coupler is large and virtually occupies the entire central part of the coupling device, such that the voltage divider would have to occupy the space left by the condenser at the connection end (narrower end), but this entails a problem because the connection end is at high-voltage, whereas the voltage is zero at the other end (wider end). The voltage divider also has to have an end connected to the high-voltage and the other to zero voltage, but if one attempts to place it in the end left by the condenser, the end at zero voltage of the divider is in the same area as the end at high-voltage of the condenser, which involves a poor distribution of the electric field and the insulation of the device.

OBJECT OF THE INVENTION

To solve the aforementioned technical problems, the coupling device comprises a DIN C connector (wherein DIN stands for "Deutsches Institut für Normung", the German standardization organization) with two terminal contacts housing an elongated condenser the ends of which are in contact with the two terminal contacts and instead of occupying a centralized position with respect to the same, it has been moved parallely to an axis which would passed through the two contacts to leave a space for the resistances of a resistive voltage divider. Furthermore, the resistances of the voltage divider have been arranged in zig-zag form but all of them being aligned and parallel to the mentioned axis of the device. The voltage divider can be connected in parallel (i.e., with both ends connected to the same contacts as the condenser) or can have the lower end connected to an additional contact.

The coupling device can comprise an outer element made of resin coupleable to the base of the DIN C connector. This outer element houses therein a synchronization circuit which is connected to the condenser through one of the terminal contacts. This outer element can house a resistance, part of the voltage divider, which is connected to one of the terminal contacts or to the additional contact of the DIN C connector. This outer element incorporates connectors for the input of data and for taking voltage measurement.

BRIEF DESCRIPTION OF THE DRAWINGS

For the purpose of aiding to better understand the features of the invention according to a preferred practical embodiment thereof, a set of drawings is attached to the following description in which the following has been depicted with an illustrative character.

DETAILED DESCRIPTION OF THE INVENTION

Figure 1:
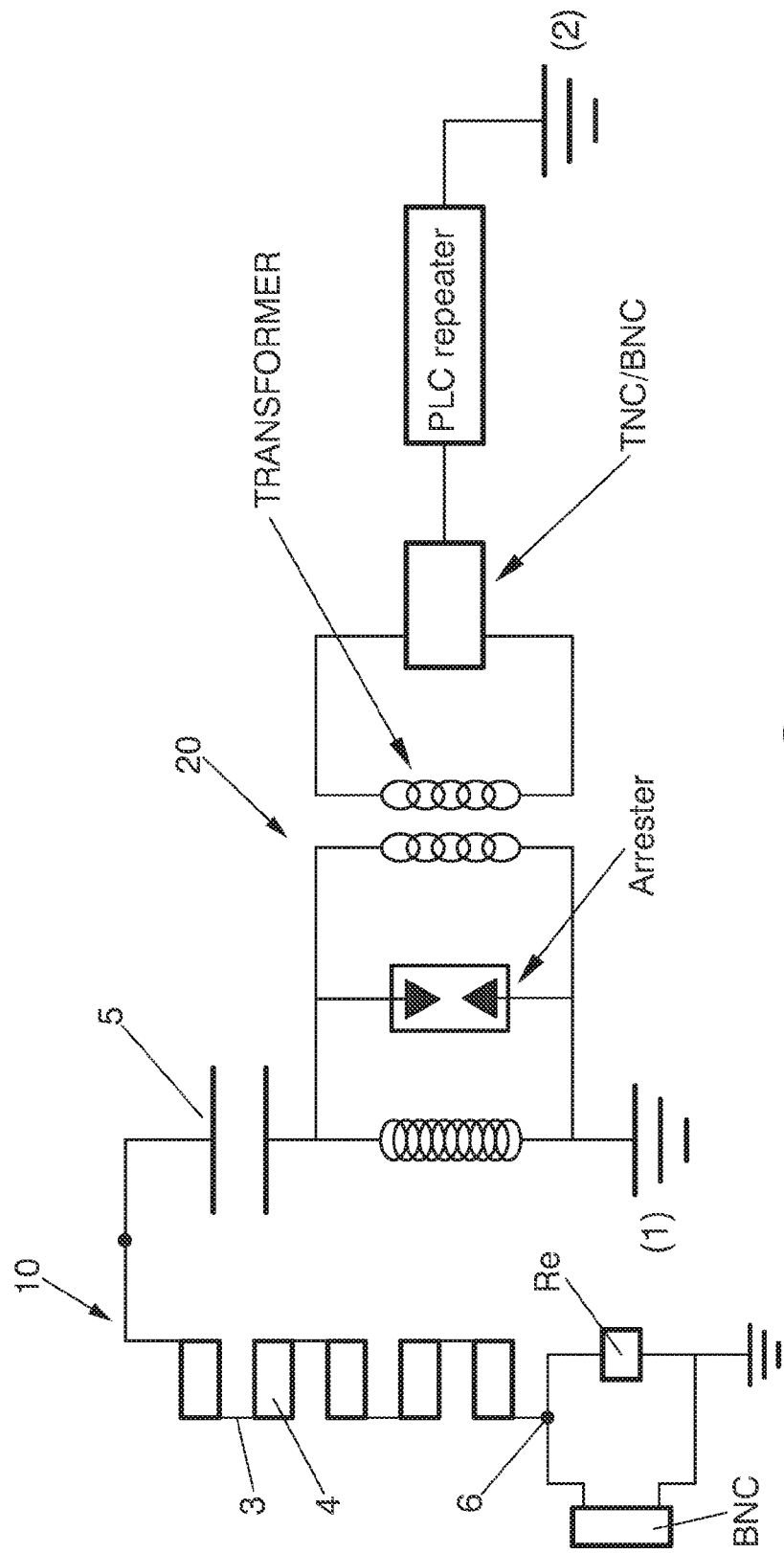
FIG. 1 shows a diagram of the coupling device of the invention.

In the coupling device of the invention (1) the condenser (performing the function of a coupler) and the voltage divider (comprising connections 3 and resistances 4) are arranged inside a DIN C connector (10), without there being interference between both elements.

The electric field distribution of each circuit, since it is subjected to a high-voltage must be similar in both elements, because otherwise the electrical gradients inside the device will make it unviable from the electrical safety viewpoint. The two circuits can have an independent connection (6) in the low-voltage part or be connected in parallel between the two contacts (2,2') of the DIN C connector (10).

Figure 2A:
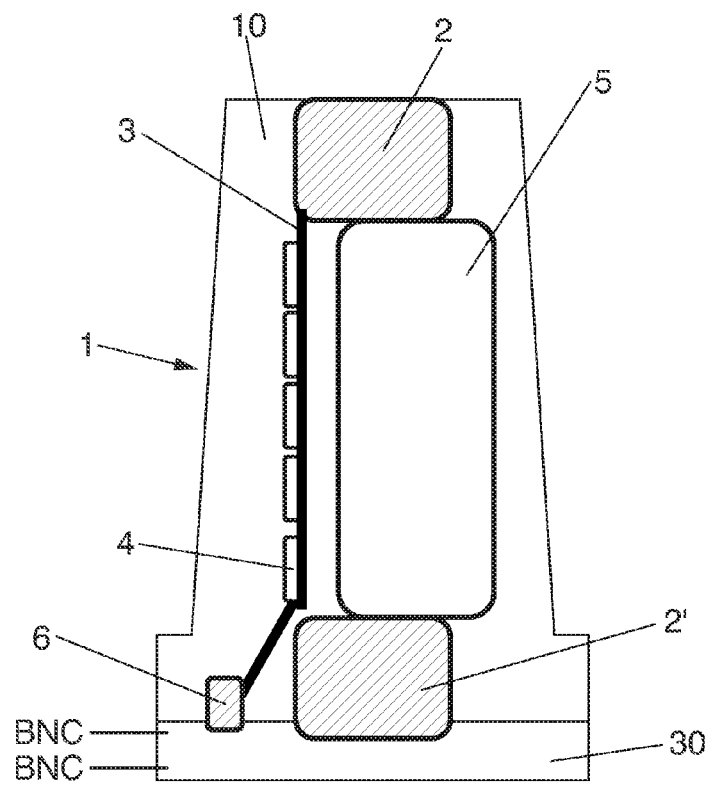
FIGS. 2a and 2b show a side view and a front view of the coupling device of the invention.
Figure 2B:
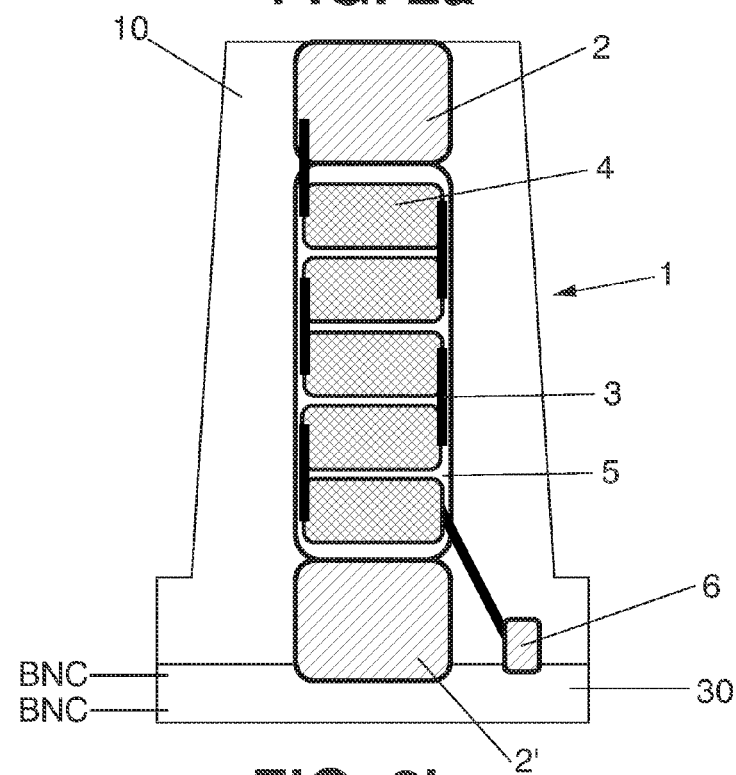

The coupling device (1), as can be seen in FIGS. 2a and 2b, is frustoconical shaped for its connection (through a T-shaped connector) to a gas insulated high-voltage cell (generally SF6, sulfur hexafluoride) comprising electrical equipment. It is a plug-in device and is provided for the electrical connection to one of the cell phases, further allowing taking the line voltage measurement in that phase. Generally, the cells are three phase cells, since they comprise three T-shaped connectors (one for each phase) and three plug-in connectors, each with its voltage divider.

The inside of the DIN C connector (10) of the invention can be seen with more detail in FIGS. 2a and 2b with its terminals (2). The condenser (5) has been designed so that it does not exceed the length of the space between said terminals (2,2'). The condenser is located inside the cone of the DIN C connector (10) leaving as much space as possible for the resistances (4) of the divider. The electric field distribution of the condenser (5) is linear, this means that at the high-voltage terminal (the upper terminal) the voltage is higher and at the lower terminal the tension is zero. The resistances (4) forming the high-voltage part of the divider are distributed in the free space attempting to keep the field distribution as similar as possible to the existing one as can be seen in FIG. 2b, being attached by connections (3). A large ceramic condenser (5) and a series of resistances (4) can thus be placed in the device such that the field distributions of both systems are compatible with one another and with those of the DIN C connector (10).

Furthermore the circuits do not interfere with one another since they are separated at all times and the design makes the electric field distributions of both devices compatible such that the electrical safety of the equipment is not compromised.

The device comprises a synchronization circuit (20) which is coupled to the lower part of the body of the DIN C connector (10). In this preferred example, the final resistance (Re) of the divider is arranged close to the synchronization circuit (20) and connected to the additional contact (6). The synchronization circuit (20) and this final resistance (Re) are housed in an outer element (30) made, for example, of resin, coupled to the base of the DIN C connector (10) by mechanical means, such as for example, a screw, and provided with connectors (BNC, which stands for Bayonet Neill-Concelman) for the input of data and for taking voltage measurements.

The invention claimed is:

1. An electric coupling device (1) comprising a DIN C connector (10) which can be plugged into a high-voltage distribution cell, two terminal contacts (2,2') and a MHz signal coupler comprising a condenser (5) in contact with the terminal contacts (2,2') characterized in that the condenser (5) is elongated and occupies an axis parallel to the imaginary central axis of the device passing through the two contacts (2,2') and in that the device further comprises a resistive voltage divider comprising resistances (4), wherein the resistances (4) of the divider are positioned in the DIN C connector parallel to the mentioned axis of the device and the resistances (4) of the divider are attached to one another by means of connections (3) in a zig-zag arrangement.

2. The device according to claim 1, wherein the divider is connected to the two terminals (2,2') parallel to the condenser (5).

3. The device according to claim 1, wherein a first end of the divider is connected to one of the terminal contacts (2) and a second end of the divider is connected to an additional contact (6) located in the low-voltage part of the device.

4. The device according to any of the preceding claims comprising a low-voltage synchronization circuit (20) housed in an outer element (30) made of resin coupleable to the base of the DIN C connector (10), such that the synchronization circuit is in contact with one of the terminals (2').

5. The device according to claim 4, wherein the voltage divider comprises an additional resistance (Re) housed in the outer element (30).

* * * * *